US006487086B2

(12) United States Patent
Ikeda

(10) Patent No.: US 6,487,086 B2
(45) Date of Patent: Nov. 26, 2002

(54) CIRCUIT MODULE

(75) Inventor: Hiroaki Ikeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/802,404

(22) Filed: Mar. 9, 2001

(65) Prior Publication Data

US 2001/0021105 A1 Sep. 13, 2001

(30) Foreign Application Priority Data

Mar. 13, 2000 (JP) .................................... 2000-068484

(51) Int. Cl.[7] ................................................ H01R 9/00
(52) U.S. Cl. ................. 361/772; 361/775; 361/764; 361/788; 257/723; 257/724; 439/59; 439/65
(58) Field of Search ................................ 361/772, 775, 361/764, 774, 760, 783, 784, 785, 803, 788, 737, 736; 710/300, 301, 306; 257/723, 724; 439/951, 59, 65, 637, 68

(56) References Cited

U.S. PATENT DOCUMENTS 4,771,366 A * 9/1988 Blake et al. ................. 257/713
6,109,929 A * 8/2000 Jasper ........................... 439/74
5,530,623 A * 9/2000 Nakajima et al. ........... 174/260
6,115,260 A * 9/2000 Nakajima et al. ........... 361/760

FOREIGN PATENT DOCUMENTS

JP          11-251539          9/1999

* cited by examiner

Primary Examiner—David Martin
Assistant Examiner—Hung Bui
(74) Attorney, Agent, or Firm—Darryl G. Walker

(57) ABSTRACT

A memory module (10) having a module bus line (15) that can be electrically connected to a main board bus line (22) by a contact terminal (12). Main board bus line (22) can be discontinuous at a module socket. Module bus line (15) can be configured on a front and back side of memory module (10) and electrically connected to the discontinued main board bus line (22) by contact terminals (12) configured on both sides of memory module (10). The front and back side module bus lines (15) can be electrically connected by a module bus through wiring (19'). Characteristic impedance matching between the main board and memory module (10) may be improved.

20 Claims, 10 Drawing Sheets

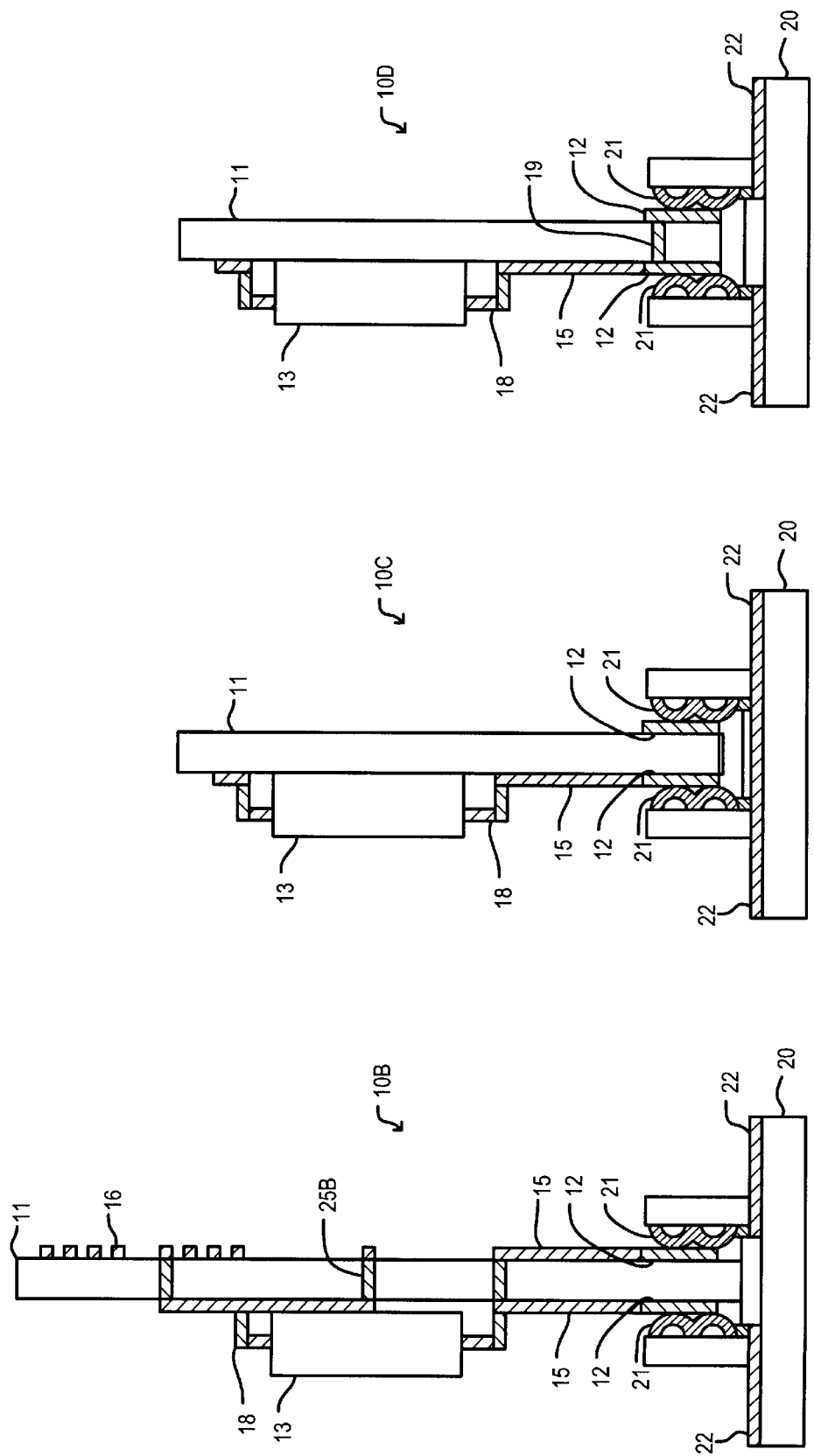

CIRCUIT MODULE

TECHNICAL FIELD

The present invention relates generally to a circuit module and more particularly to the wiring structure of a circuit module for adopting a stereoscopic wiring structure on a main board.

BACKGROUND OF THE INVENTION

Data processing systems such as personal computers can require varying amounts of semiconductor memory. One method of allowing flexibility in the density of semiconductor memory used in a system is to provide a plurality of sockets or slots in which memory modules can be inserted. As the operating speed of such systems increase, memory modules are needed to operate at faster speeds. Data transfer operations to and from memory modules need to be increased while maintaining or improving memory density.

An example of a conventional memory module that can be used for a personal computer will now be illustrated. Referring to FIG. 14, a cross-sectional view of a conventional memory module and socket is set forth with conventional memory module designated by the general reference character 10C. The conventional memory module 10C and socket of FIG. 14 include a main board 20 upon which a main board bus 22 and main board control signal lines (not shown) are formed. The main board 20 includes a memory socket. The memory socket includes socket terminals 21 connected to the main board bus 22 and main board control signal lines. Conventional memory module 10C is inserted in the socket in such a manner as to form a T-type stub structure with respect to the main board bus 22 and main board signal lines.

Conventional memory module 10C has contact terminals 12 on each side of a wiring board 11 which connect to the contact terminals 12 so that conventional memory module 10C can receive and transmit signals from/to main board 20 respectively. A module bus 15 is formed upon wiring board 11 and is connected to contact terminals 12. Conventional memory module 10C includes a Dynamic Random Access Memory (DRAM) 13, which has lead terminals 18 connected to module bus 15.

Main board 20 will typically include a plurality of sockets in which memory modules can be inserted. The plurality of sockets are arranged so that they are connected electrically in a parallel fashion on the main board 20. A control clock (not shown) is typically used to synchronize command operations and data transfer to and from memory modules. When the frequency of the control clock is increased up to 100 MHz, the number of memory modules 10C that can be connected in parallel when using the T-type stub structure is limited to four. When the frequency of the control clock is 133 MHz or more, the number of memory modules 10C that can be connected in parallel when using the T-type stub structure is limited to two and the rate at which data can be read from or written to the memory modules is limited to approximately 200 Megabit per second per pin (Mbps/pin). These limitations can be due to limitations in signal transmissions caused by reflections and distortions due to impedance mismatches caused by the T-type stub structure.

As the operating speeds of personal computers increase and the bit density of semiconductor memory increases, speed and density requirements for memory modules increase. In order to better meet these demands, a memory module and socket structure in which a main board bus is branched at a contact terminal has been proposed in place of the T-type stub structure and is disclosed in Japanese Patent Application Laid-Open No. Hei 11-251539.

Referring now to FIG. 15, a cross-sectional view of a conventional memory module and socket is set forth with conventional memory module designated by the general reference character 10D. In the conventional memory module and socket of FIG. 15, main board bus 22 is discontinuous on main board 20 and connects to socket terminals 21. Socket terminals 21 are contacted with contact terminals 12, which are positioned on each side of wiring board 11. Contact terminals 12 on opposite sides of wiring board 11 are connected by a contact terminal through wiring 19. Contact terminal through wiring 19 is formed in a through hole that pierces printed wiring board 11. Each lead terminal 18 of DRAM 13 is connected to a respective contact terminal by module bus 15 which is a printed wiring layer formed on wiring board 11.

In Japanese Patent Application Laid-Open No. Hei 11-251539, it is proposed that with conventional memory module and socket of FIG. 15, limitations in signal transmissions caused by reflections and distortions due to impedance mismatches caused by the stub structure set forth is reduced and operating speeds of memory module 10D is improved. In such a case, the memory module 10D can be operated with a control clock frequency up to approximately 200 MHz and the rate at which data can be read from or written to the memory modules is limited to approximately 400 Mbps/pin.

In view of the above discussion, it would be desirable to provide a memory module having improved operating speeds over conventional approaches. It would also be desirable to improve operating speeds without reducing the number of modules allowed on a main board.

SUMMARY OF THE INVENTION

According to the present embodiments, a module includes integrated circuits (ICs) such as a memory attached to a side of a wiring board. The module can include contact terminals attached to opposing sides of the wiring board in order to make electrical contact at a socket connection on a main board. Wirings may be formed on each side of the wiring board to form signal paths from the contact terminals to pins or external terminals of ICs. Through wirings may provide signal paths between two wirings formed on opposite sides of the wiring board.

According to one aspect of the embodiments, a through wiring can be located at a distance from the contact terminals.

According to another aspect of the embodiments, a through wiring can be located near a pin or external terminal of an IC.

According to another aspect of the embodiments, a through wiring can be located farther from the contact terminals than at least one pin or external terminal of an IC.

According to another aspect of the embodiments, the module can include a buffer, receiving signals from contact terminals and providing outputs to be received by at least one IC on the module.

According to another aspect of the embodiments, wirings can provide signal paths between contact terminals and a buffer, a through wiring can provide signal paths between wirings on opposite sides of a wiring board.

According to another aspect of the embodiments, one wiring can provide a signal path from a contact terminal on one side of a wiring board to a pin or external terminal of an IC. Another wiring can provide a signal path from another contact terminal on an opposite side of a wiring board to a pin or external terminal of another IC. The two wirings can have portions arranged in parallel with each other. The two wirings can have a through wiring providing an signal path between them.

According to another aspect of the embodiments, the main board can include a main board wiring having a discontinuity at a socket or slot.

According to another aspect of the embodiments, a plurality of sockets can provide parallel connection between a plurality of modules.

According to another aspect of the embodiments, at least one IC can be a Random Access Memory.

According to another aspect of the embodiments, at least one IC can be a Double Data Rate Random Access Memory.

According to another aspect of the embodiments, at least one IC can be a Quadruple Data Rate Random Access Memory.

According to another aspect of the embodiments, selected wirings providing signal paths from contact terminals to an IC can be electrically connected to through wirings, while other wirings providing signal paths from contact terminals to an IC are not electrically connected to through wirings.

According to another aspect of the embodiments, at least one IC can be attached to a front side of a wiring board and at least one IC can be attached to a back side of the wiring board.

BRIEF DESCRIPTION OF THE DRAWINGS

FIG. 13 is a cross-sectional view of a memory module and socket according to an embodiment.

FIG. 14 is a cross-sectional view of a conventional memory module and socket.

FIG. 15 is a cross-sectional view of a conventional memory module and socket.

DETAILED DESCRIPTION OF THE EMBODIMENTS

Various embodiments of the present invention will now be described in detail with reference to a number of drawings.

Figure 1:
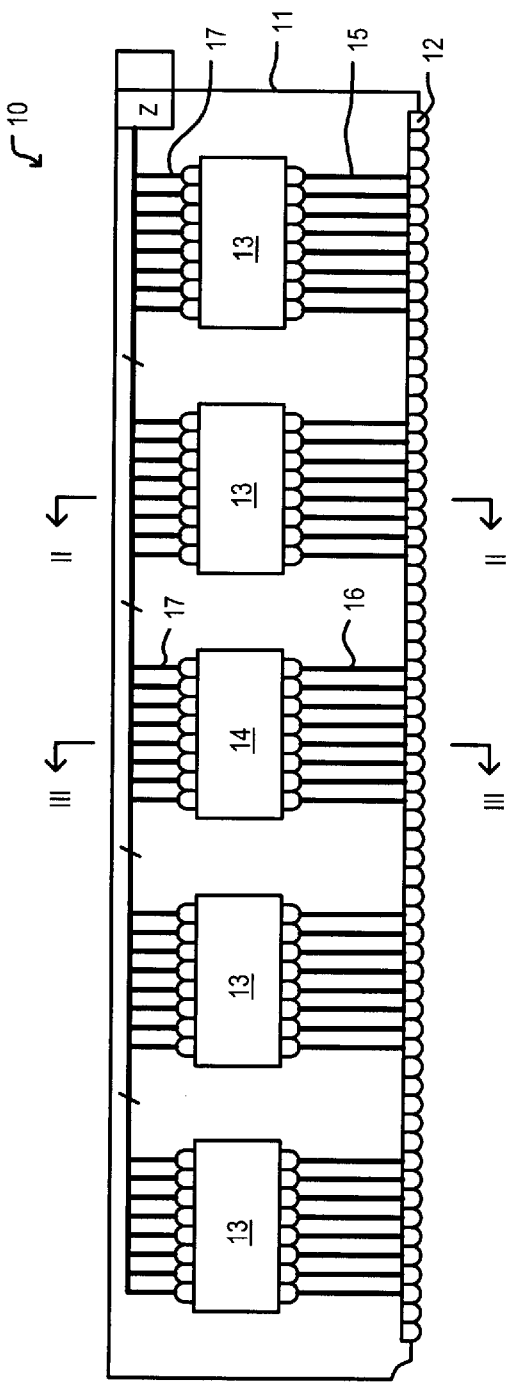
FIG. 1 is a front view of a memory module according to an embodiment.

Referring now to FIG. 1, a front view of memory module according to an embodiment is set forth and given the general reference character 10. Memory module 10 may include a printed wiring board 11, four memories 13, and a buffer 14.

Memory module 10 can have multiple contact terminals 12 arranged at a lower edge of the front and back sides of printed wiring board 11. Module bus lines 15 can provide an electrical connection between selected contact terminals 12 and memories 13. The module bus lines 15 can provide a 64-bit bus width on a front side of printed wiring board 11. Memory module 10 can include control signal bus lines 16 that can provide an electrical connection between selected contact terminals and inputs to buffer 14. Control signal bus lines 16 can include a clock line, an address line and an instruction line. Outputs of buffer 14 can be electrically connected to each DRAM 13 by control signal bus lines 17. Each memory 13 can be a Dynamic Random Access Memory as just one example.

Each dedicated module bus line 15 can be used to transmit a signal to a memory 13 and can be used to electrically connect a memory 13 with another memory (not shown) on another memory module (not shown) connected via a slot in parallel with memory module 10. Each control signal bus line 17 can be connected to the four memories 13 arranged on one memory module 10. Control signal bus lines 16 can be electrically connected to control signal bus lines on another memory module (not shown) connected via a slot in parallel with memory module 10.

Figure 2:
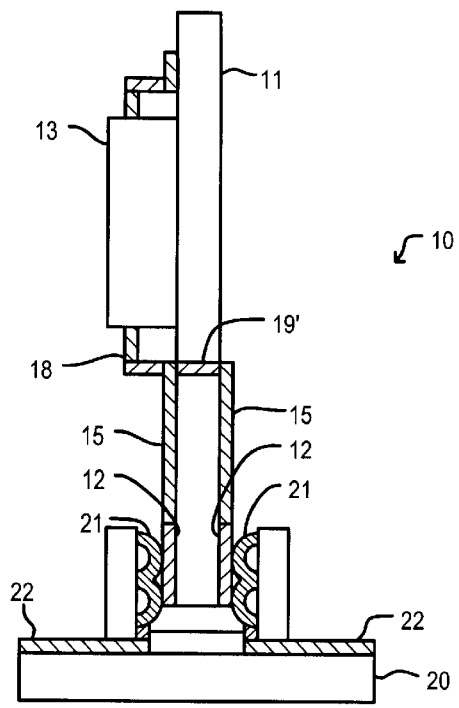
FIG. 2 is a cross-sectional view of a memory module and socket according to an embodiment.

Referring now to FIG. 2, a cross-sectional view of a memory module 10 of FIG. 1 viewed along the line II—II and socket is set forth according to an embodiment. In the memory module and socket of FIG. 2, main board bus 22 can be discontinuous on main board 20 and can connect to socket terminals 21. Socket terminals can be contacted with contact terminals 12, which can be positioned on each side of wiring board 11.

Contact terminals 12 on the front side of wiring board 11 can be electrically connected to a pin 18 of memory 13 by a module bus line 15 which can also be formed on the front side of wiring board 11. Each contact terminal 12 on the back side of memory module 10 can be electrically connected to a module bus line 15 which can also be formed on the back side of wiring board 11. Module bus line 15 on the back side of memory module 10 can be electrically connected to module bus line 15 on the front side of memory module 10 by module bus line through wiring 19'. Module bus line through wiring 19' can be formed in a through hole that pierces printed wiring board 11. In this manner each contact terminal 12 on the front side of memory module 10 can be electrically connected to a contact terminal 12 on the back side of memory module 10.

Figure 3:
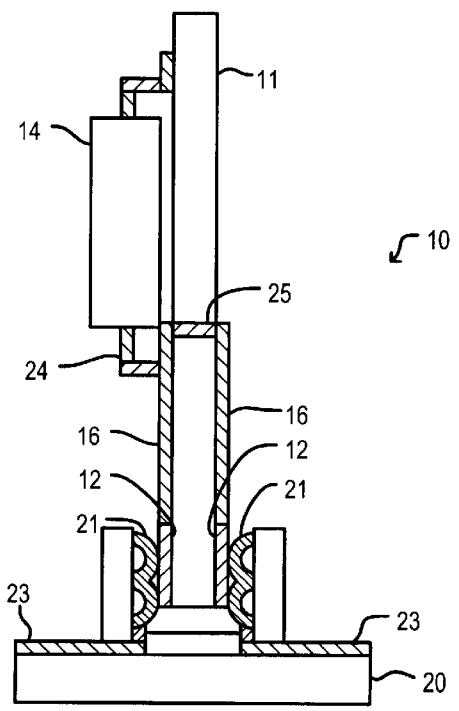
FIG. 3 is a cross-sectional view of a memory module and socket according to an embodiment.

Referring now to FIG. 3, a cross-sectional view of a memory module 10 of FIG. 1 viewed along the line III—III and socket is set forth according to an embodiment. In the memory module and socket of FIG. 3, main board control signal bus line 23 can be discontinuous on main board 20 and can connect to socket terminals 21. Socket terminals can be contacted with contact terminals 12, which can be positioned on each side of wiring board 11.

Contact terminals 12 on the front side of wiring board 11 can be electrically connected to a pin 24 of buffer 14 by a module control signal bus line 16 which can also be formed on the front side of wiring board 11. Each contact terminal 12 on the back side of memory module 10 can be electrically connected to a module control signal bus line 16 which can also be formed on the back side of wiring board 11. Module control signal bus line 16 on the back side of memory module 10 can be electrically connected to module control signal bus line 16 on the front side of memory module 10 by module bus line through wiring 25. Module bus line through wiring 25 can be formed in a through hole that pierces printed wiring board 11. In this manner each contact terminal 12 on the front side of memory module 10 can be electrically connected to a contact terminal 12 on the back side of memory module 10.

Figure 4:
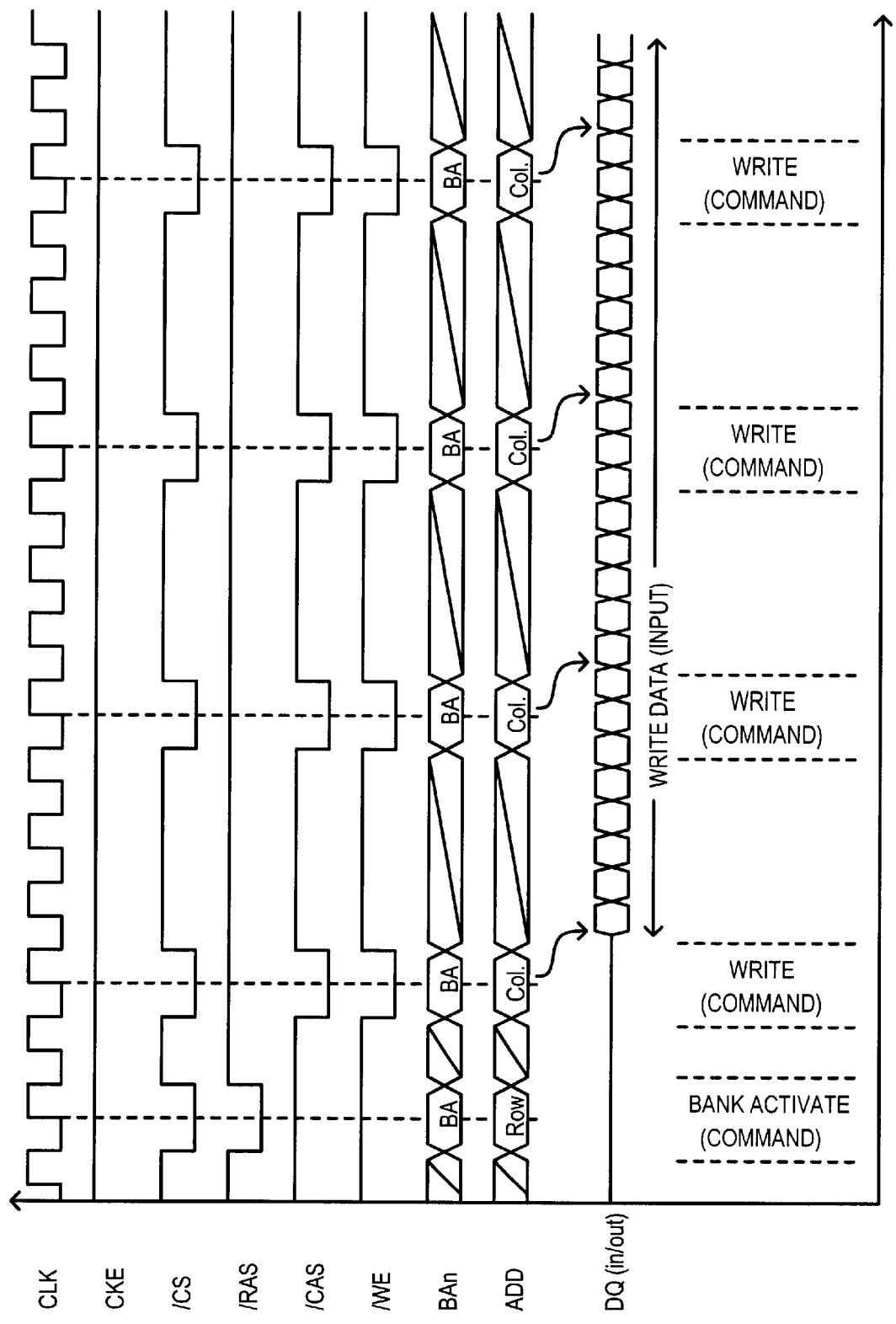
FIG. 4 is a timing diagram illustrating writing data to a memory of a memory module according to an embodiment.

Referring now to FIG. 4, a timing diagram is set forth illustrating writing data to a memory 13 of memory module 10. The timing diagram of FIG. 4 can include a clock CLK, a clock enable CKE, chip select /CS, row address strobe /RAS, column address strobe /CAS, write enable /WE, bank address BAn, address ADD, and data DQ. BAn, ADD, and DQ can each be a bus composed of multiple signal lines. In this example, the memory 13 can be a Double Data Rate Synchronous Dynamic Random Access Memory (DDR-SDRAM). Memory 13 can have a burst length of 8 and a Column Address Strobe (CAS) latency of 2. Memory 13 can have data written or read on both a leading edge and a trailing edge of CLK as opposed to a conventional Single Data Rate (SDR) SDRAM.

The frequency of CLK can be 133 MHz, thus data can be transferred at a frequency of 266 MHz. When CKE is at a high logic level, memory 13 can receive commands and read or write data. /CS can operate as a select signal to select a memory 13 to receive a command instruction. /CS can also be wired and operate to select a group of memories 13 on a memory module 10 to receive a command and operate in a parallel fashion.

When a memory cell access to a memory 13 is to occur, a bank of memory cells on the memory can be activated with a BANK ACTIVATE command. A BANK ACTIVATE command can include CKE high, /CS low, /RAS low, /CAS high, and /WE high at the rising edge of CLK. At this time memory 13 can receive a bank address BA and row address ROW on BAn and ADD, respectively. Thus, a bank can be selected and a word (row) line can be activated in the selected bank in memory 13. A WRITE command can then be executed. A WRITE command can include CKE high, /CS low, /RAS high, /CAS low, and /WE low at the rising edge of CLK. At this time memory 13 can receive a bank address BA and column address COL on BAn and ADD, respectively. Thus, when data is received it can be written to predetermined columns along the activated word line in the selected bank. After the predetermined CAS latency, data can be received by memory 13 on data bus DQ. Data can be transmitted on data bus DQ at a rate of 266 MHz. Data bus DQ can operate at double the frequency of CLK. However, because the burst length is 8 bits, /CS, /CAS, /WE, Ban and ADD signals can be transmitted at one-fourth to one-half the frequency of CLK. Thus, the frequency of each control signal line can be 133/2 MHz or less and lower speed control signal lines can be used on the memory module 10 without adverse affects as compared to data bus signal lines.

Figure 5:
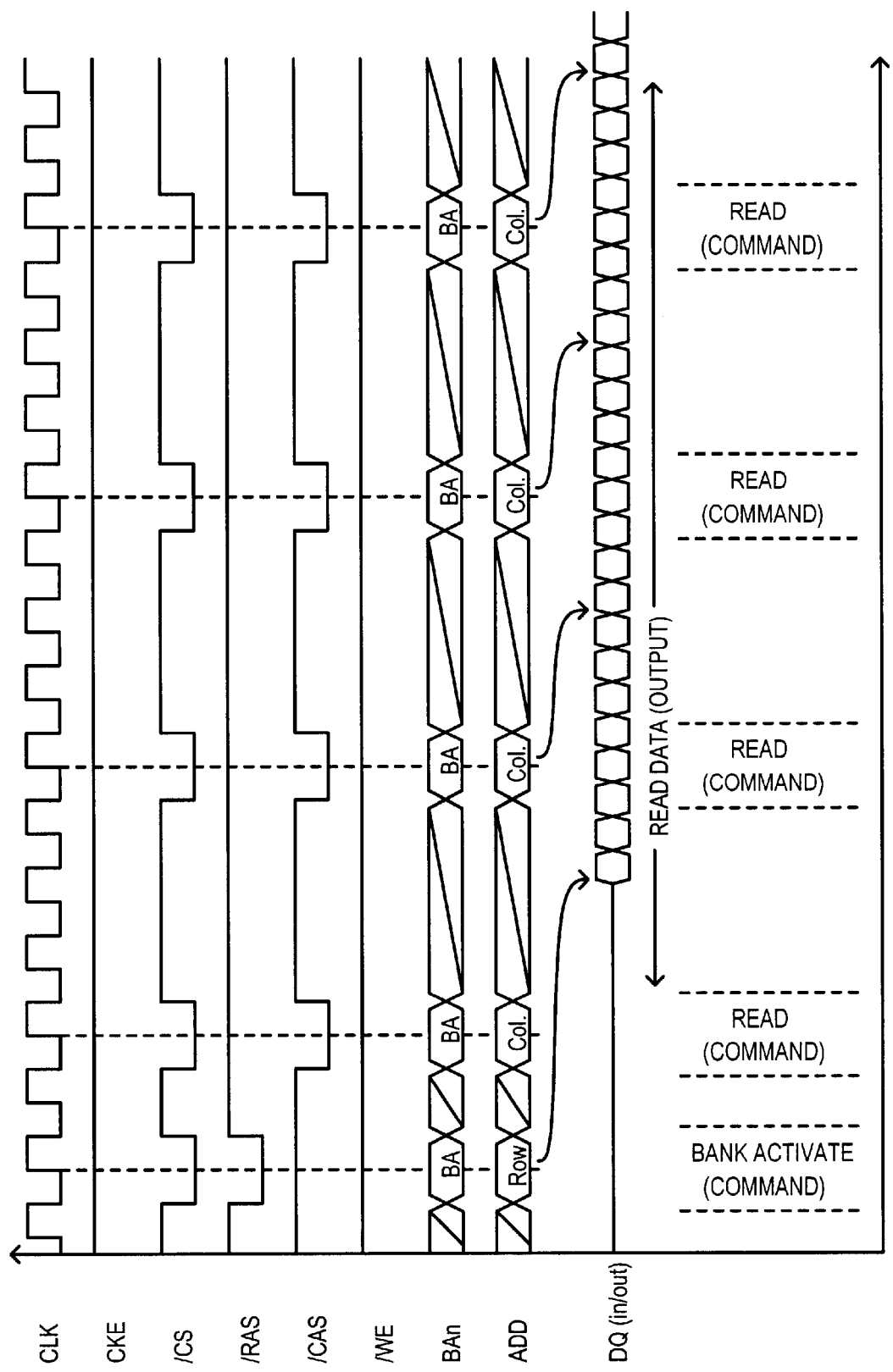
FIG. 5 is a timing diagram illustrating reading data from a memory of a memory module according to an embodiment.

Referring now to FIG. 5, a timing diagram is set forth illustrating reading data from a memory 13 of memory module 10. The timing diagram of FIG. 5 can include a clock CLK, a clock enable CKE, chip select /CS, row address strobe /RAS, column address strobe /CAS, write enable /WE, bank address BAn, address ADD, and data DQ. BAn, ADD, and DQ can each be a bus composed of multiple signal lines. Memory 13 can be a Double Data Rate Synchronous Dynamic Random Access Memory (DDR-SDRAM). Memory 13 can have a burst length of 8 and a Column Address Strobe (CAS) latency of 2. Memory 13 can have data written or read on both a leading edge and a trailing edge of CLK as opposed to a conventional Single Data Rate (SDR) SDRAM.

When a memory cell access to a memory 13 is to occur, a bank of memory cells on the memory can be activated with a BANK ACTIVATE command. A BANK ACTIVATE command can include CKE high, /CS low, /RAS low, /CAS high, and /WE high at the rising edge of CLK. At this time memory 13 can receive a bank address BA and row address ROW on BAn and ADD, respectively. Thus, a bank can be selected and a word (row) line can be activated in the selected bank in memory 13. A READ command can then be executed. A READ command can include CKE high, /CS low, /RAS high, /CAS low, and /WE high at the rising edge of CLK. At this time memory 13 can receive a bank address BA and column address COL on BAn and ADD, respectively. Thus, data can be read from predetermined columns along the activated word line in the selected bank. After the predetermined CAS latency, data can be output by memory 13 onto data bus DQ. Data can be transmitted on data bus DQ at a rate of 266 MHz. Data bus DQ can operate at double the frequency of CLK. However, because the burst length is 8 bits, /CS, /CAS, /WE, Ban and ADD signals can be transmitted at one-fourth to one-half the frequency of CLK. Thus, the frequency of each control signal line can be 133/2 MHz or less and lower speed control signal lines can be used on the memory module 10 without adverse affects as compared to data bus signal lines.

Figure 6:
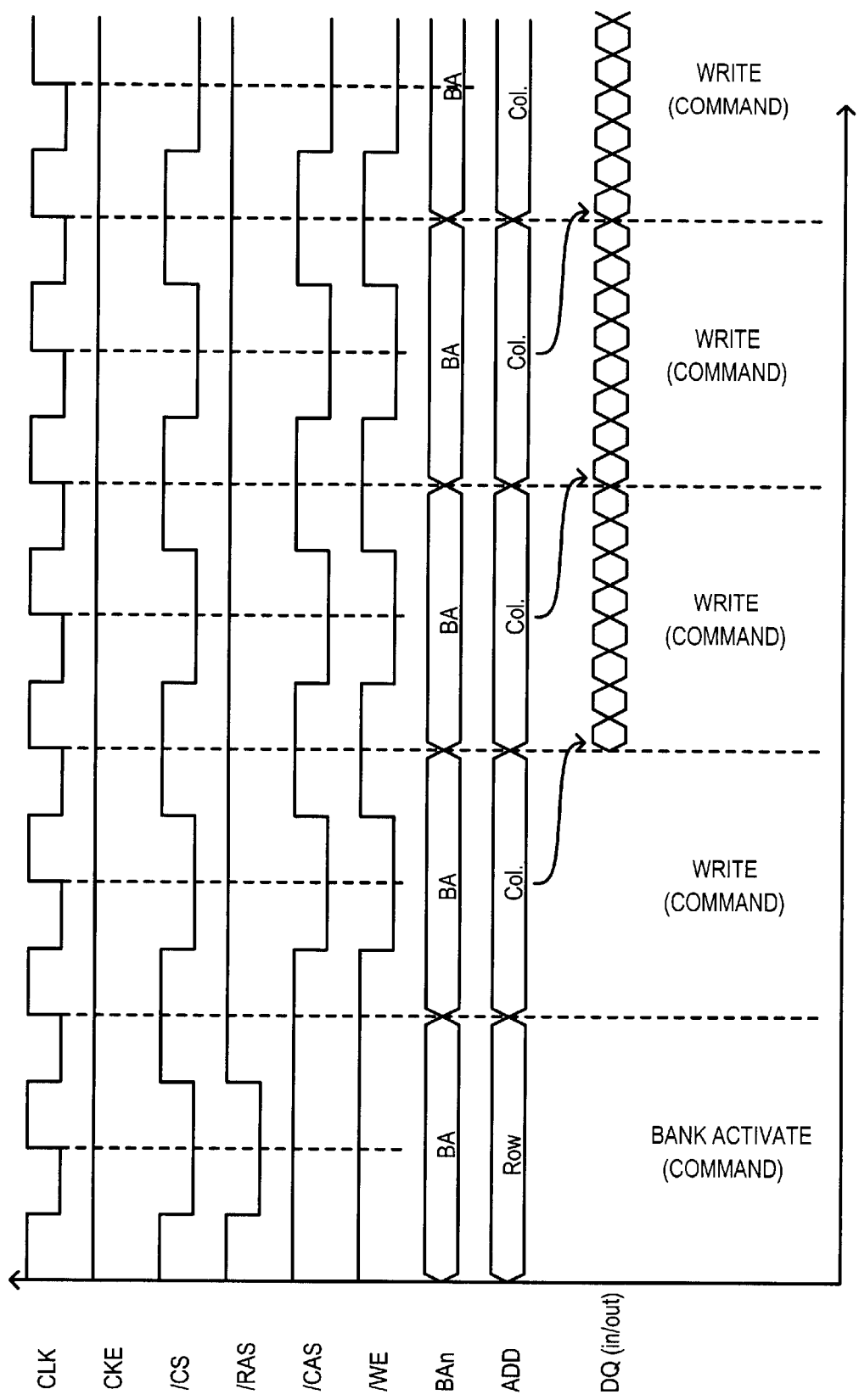
FIG. 6 is a timing diagram illustrating writing data to a memory of a memory module according to an embodiment
Figure 7:
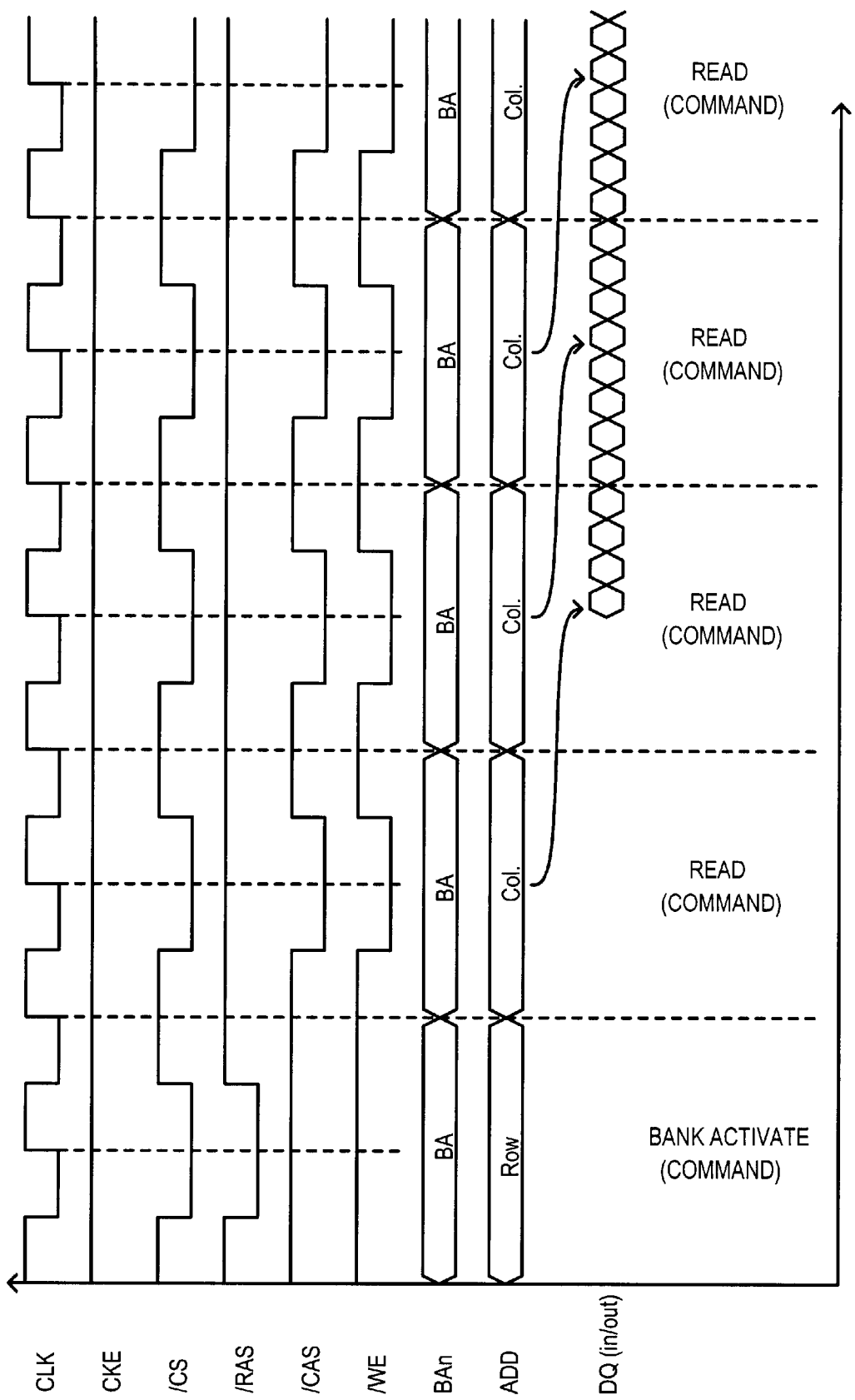
FIG. 7 is a timing diagram illustrating reading data from a memory of a memory module according to an embodiment

Referring now to FIGS. 6 and 7, a timing diagrams are set forth illustrating writing and reading, respectively, data to/from a memory 13 of memory module 10. The timing diagram of FIG. 6 can include a clock CLK, a clock enable CKE, chip select /CS, row address strobe /RAS, column address strobe /CAS, write enable /WE, bank address BAn, address ADD, and data DQ. BAn, ADD, and DQ can each be a bus composed of multiple signal lines. In this example, the memory 13 can be a Quadruple Data Rate Synchronous Dynamic Random Access Memory (QDR-SDRAM). Memory 13 can have a burst length of 8 and a Column Address Strobe (CAS) latency of 2. In this case, a second CLK (not shown) can be offset or phase shifted from CLK by one-fourth of a cycle. Memory 13 can then have data written or read on both a leading edge and a trailing edge of both a first CLK and a second CLK. In this manner, when CLK has a frequency of 133 MHz, data can be transmitted on data bus DQ at a rate of 532 MHz.

Figure 8A:
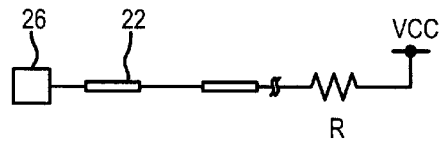
FIG. 8a is a circuit diagram illustrating the characteristic impedance of a main board bus.
Figure 8B:
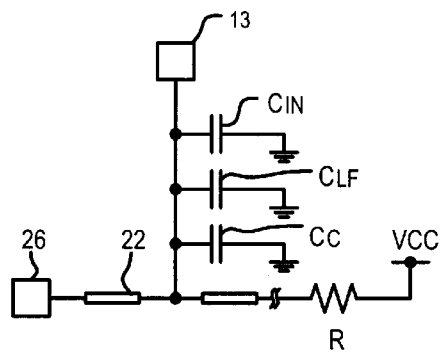
FIG. 8b is a circuit diagram illustrating the characteristic impedance of a main board bus and a conventional memory module.
Figure 8C:
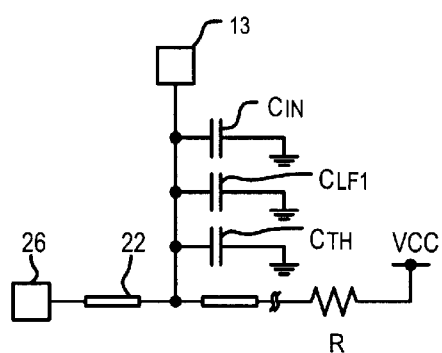
FIG. 8c is a circuit diagram illustrating the characteristic impedance of a main board bus and a conventional memory module.
Figure 8D:
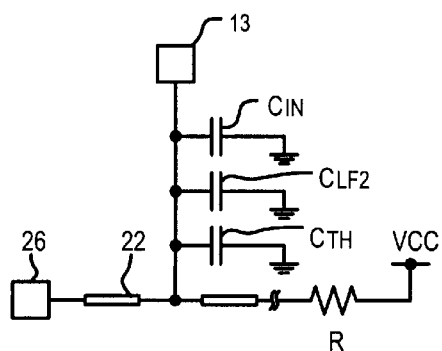
FIG. 8d is a circuit diagram illustrating the characteristic impedance of a main board bus and a memory module according to an embodiment.

Referring to FIGS. 8a to 8d, circuit diagrams are set forth illustrating the characteristic impedances of various main board, sockets and memory module configurations. In FIGS. 8a to 8d, terminal 26 can be positioned 10 cm from the socket or slot. R can be a signal line termination resistor. FIG. 8a illustrates the characteristic impedance of main board bus 22. FIG. 8b illustrates the characteristic impedance of main board bus 22 and memory module 10C in the conventional T-type stub structure of FIG. 14. FIG. 8c illustrates the characteristic impedance of main board bus 22 and memory module 10D in the conventional contact terminal through wiring 19 structure of FIG. 15. FIG. 8d illustrates the characteristic impedance of main board bus line 22 and memory module 10 in the disclosed embodiment using the module bus line through wiring 19'.

The characteristic impedance Z0 of main board bus line 22 according to the circuit of FIG. 8a can be designed so that it can be approximately 75 Ω. Characteristic impedance Z0 can be mathematically expressed as: $Z0=\{(L*d)/(C*d)\}^{1/2}$. C and L can denote capacitance per unit length and inductance per unit length, respectively, of bus line wiring and d can represent a length of bus line wiring.

The characteristic impedance Z1 of main board bus 22 and memory module 10C in the conventional T-type stub structure as illustrated in the circuit of FIG. 8b can be mathematically expressed as: $Z1=\{(L*d)/(C*d+C_C+C_{LF}+C_{IN})\}^{1/2}$. $C_C$ can denote the capacitance of the module socket, $C_{LF}$ can denote the input capacitance of signal wiring, and $C_{IN}$ can denote the input capacitance at the pin of the memory chip or integrated circuit. Characteristic impedance Z1 can be approximately 36 Ω.

The characteristic impedance Z2 of main board bus 22 and memory module 10D in the conventional contact terminal through wiring 19 structure as illustrated in the circuit of FIG. 8c can be mathematically expressed as: $Z2=\{(L*d)/(C*d+C_{TH}+C_{LF1}+C_{IN})\}^{1/2}$. $C_{TH}$ can denote the capacitance of the module socket in the through hole case. Characteristic impedance Z2 can be approximately 42.8 Ω.

The characteristic impedance Z3 of main board bus 22 and memory module 10 in the module bus line through wiring 19' structure as illustrated in the circuit of FIG. 8d can be mathematically expressed as: $Z2=\{(L*d)/(C*d+C_{TH}+C_{LF2}+C_{IN})\}^{1/2}$. Characteristic impedance Z3 can be approximately 51.1 Ω.

It is noted that in the calculations above, by using the module bus line through wiring 19' the characteristic impedance Z3 can have a smaller difference, compared with conventional approaches in Z1 and Z2, than the ideal characteristic impedance Z0 of just the main board bus line 22. This can reduce reflections and distortions caused by impedance mismatches. Therefore, operating frequencies can be increased.

If the capacitance and inductance of the module wiring and the socket are selected so that they are equal to the capacitance and the inductance of wiring on the wiring board, the characteristic impedances can similarly be determined to be approximately as follows: Z0=75 Ω, Z1=35 Ω, Z2=41.2 Ω, and Z3=46.1 Ω.

Figure 9:
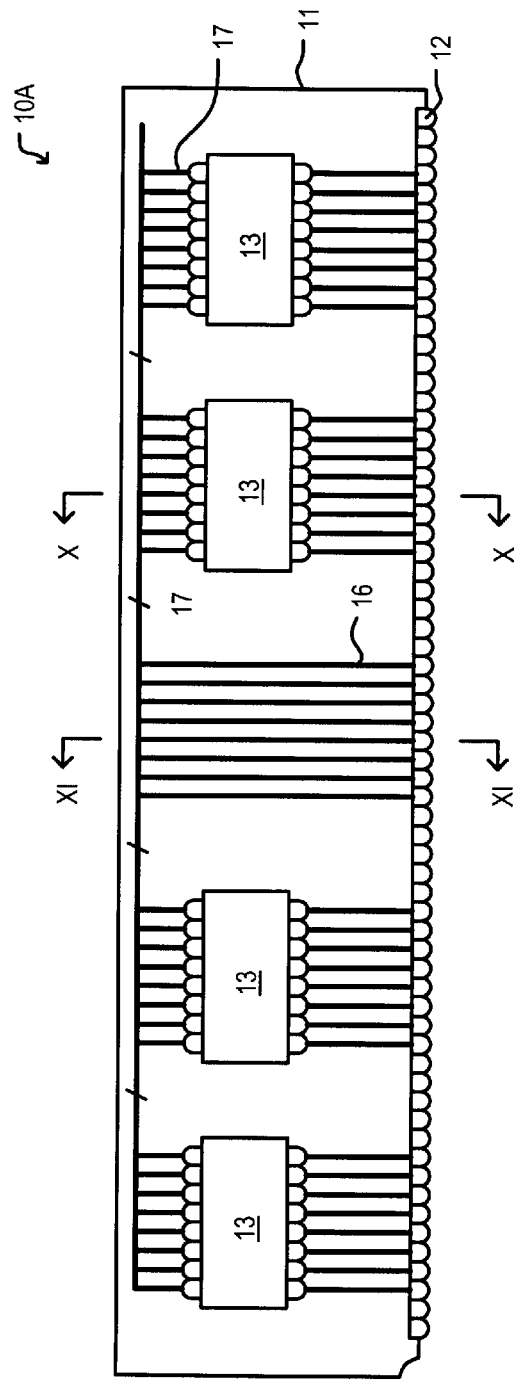
FIG. 9 is a front view of a memory module according to an embodiment.

Referring now to FIG. 9, a front view of a memory module according to an embodiment is set forth and given the general reference character 10A. Memory module 10A may include a printed wiring board 11 and four memories 13. In the memory module 10A, control signal bus lines 16 can be provided to electrically connect contact terminals 12 to pins of memories 13.

Figure 10:
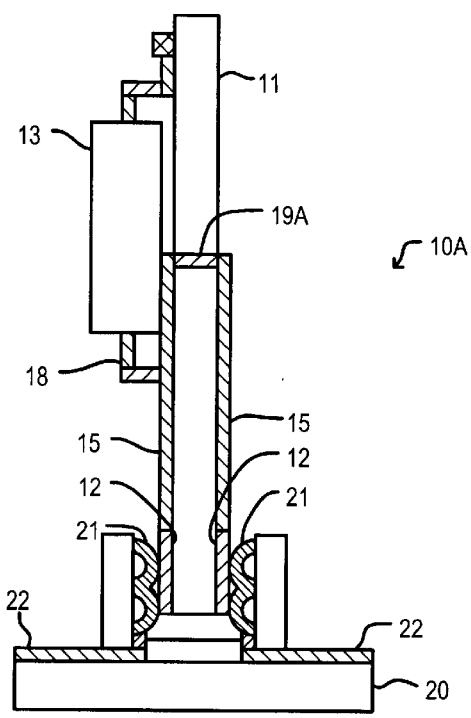
FIG. 10 is a cross-sectional view of a memory module and socket according to an embodiment.

Referring now to FIG. 10, a cross-sectional view of a memory module 10A of FIG. 9 viewed along the line X—X and socket is set forth according to an embodiment. In the memory module and socket of FIG. 10, main board bus 22 can be discontinuous on main board 20 and can connect to socket terminals 21. Socket terminals can be contacted with contact terminals 12, which can be positioned on each side of wiring board 11.

Contact terminals 12 on the front side of wiring board 11 can be electrically connected to a pin 18 of memory 13 by a module bus line 15 which can also be formed on the front side of wiring board 11. Each contact terminal 12 on the back side of memory module 10 can be electrically connected to a module bus line 15 which can also be formed on the back side of wiring board 11. Module bus line 15 on the back side of memory module 10 can be electrically connected to module bus line 15 on the front side of memory module 10 by module bus line through wiring 19A. Module bus line through wiring 19A can be formed in a through hole that pierces printed wiring board 11. In this manner each contact terminal 12 on the front side of memory module 10A can be electrically connected to a contact terminal 12 on the back side of memory module 10A.

It can be noted that in the embodiment of FIG. 2, module bus line through wiring 19' can be situated near where a pin of memory 13 and module bus line 15 are connected. However, in the embodiment of FIG. 10 module bus line through wiring 19A can be situated at a position that can be farther away from the contact terminal 12 than where a pin of memory 13 and module bus line 15 are connected. This can allow the characteristic impedance of wiring on main board 20 to be more closely matched with the characteristic impedance of wiring on memory module 10A. Also, the degree of freedom in the layout of the module bus line through wiring 19A may be improved. With the embodiment of FIG. 10, characteristic impedance Z3 can be approximately 53.7 Ω.

Figure 11:
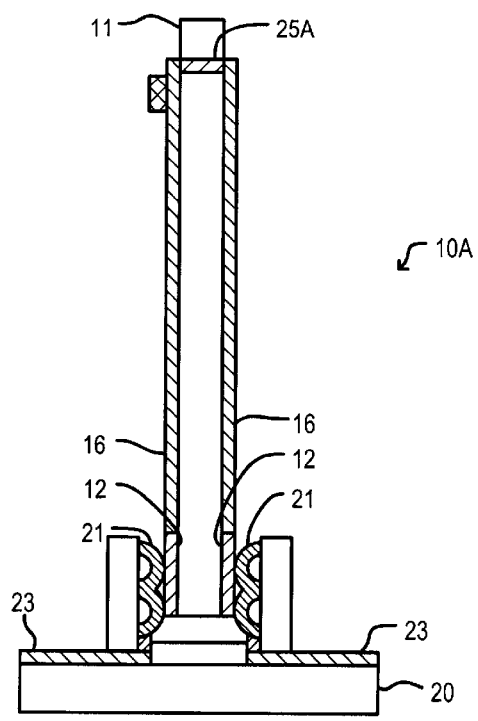
FIG. 11 is a cross-sectional view of a memory module and socket according to an embodiment.

Referring now to FIG. 11, a cross-sectional view of a memory module 10A of FIG. 9 viewed along the line XI—XI and socket is set forth according to an embodiment. In the memory module and socket of FIG. 11, main board control signal bus line 23 can be discontinuous on main board 20 and can connect to socket terminals 21. Socket terminals can be contacted with contact terminals 12, which can be positioned on each side of wiring board 11.

Each contact terminal 12 on the back side of memory module 10A can be electrically connected to a module control signal bus line 16 which can also be formed on the back side of wiring board 11. Module control signal bus line 16 on the back side of memory module 10A can be electrically connected to module control signal bus line 16 on the front side of memory module 10A by module bus line through wiring 25A. Module bus line through wiring 25A can be formed in a through hole that pierces printed wiring board 11. In this manner each contact terminal 12 on the front side of memory module 10 can be electrically connected to a contact terminal 12 on the back side of memory module 10.

It can be noted that in the embodiment of FIG. 3, module bus line through wiring 25 can be situated near where a pin of buffer 13 and control signal bus line 16 are connected. However, in the embodiment of FIG. 10 it is noted that buffer 13 has been eliminated and module bus line through wiring 25A can be situated at a position that can be farther away from the contact terminal 12. This can allow the characteristic impedance of wiring on main board 20 to be more closely matched with the characteristic impedance of wiring on memory module 10A. Also, the degree of freedom in the layout of the module bus line through wiring 25A may be improved.

Figure 12:
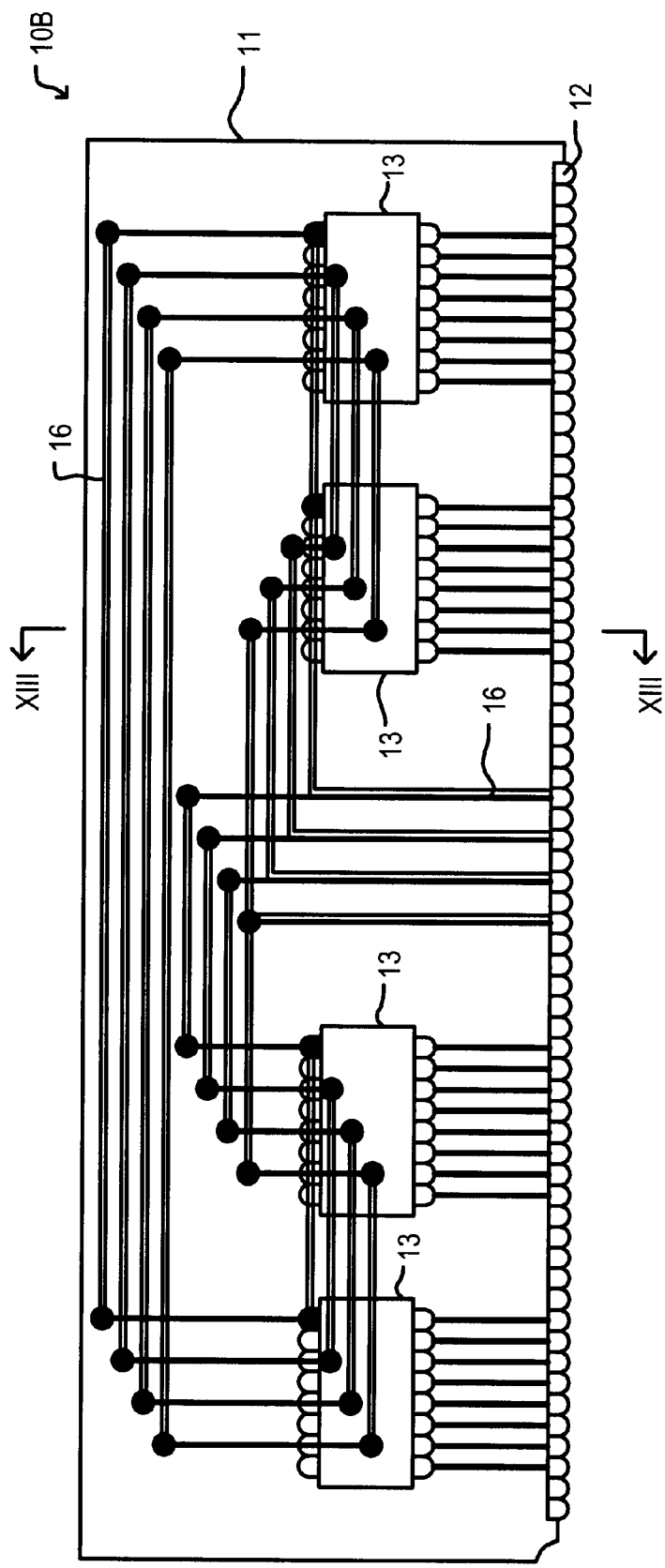
FIG. 12 is a front view of a memory module according to an embodiment.

Referring now to FIG. 12, a front view of a memory module according to an embodiment is set forth and given the general reference character 10B. Memory module 10B may include a printed wiring board 11 and four memories 13. In the memory module 10B, control signal bus lines 16 can be provided to electrically connect contact terminals 12 to pins of memories 13. In the embodiment of FIG. 12, control signal bus lines 16 can be routed on the front and back sides of wiring board 11 of memory module 10B. This can reduce electromagnetic interference (EMI) caused by control signal bus lines.

Referring now to FIG. 13, a cross-sectional view of a memory module 10B of FIG. 12 viewed along the line XIII—XIII and socket is set forth according to an embodiment. In the memory module and socket of FIG. 13, main board bus 22 can be discontinuous on main board 20 and can connect to socket terminals 21. Socket terminals can be contacted with contact terminals 12, which can be positioned on each side of wiring board 11.

Module control signal bus line 16 on the back side of memory module 10B can be electrically connected to module control signal bus line 16 on the front side of memory module 10B by module bus line through wiring 25B. Module bus line through wiring 25B can be formed in a through hole that pierces printed wiring board 11. Because no stub branch structure is used, characteristic impedances can be more closely matched.

In the embodiments of FIGS. 12 and 13, memories 13 can be symmetrically arranged on both the front and back sides of memory module 10B. This can allow EMI to be reduced in a data bus line.

In the embodiments disclosed characteristic impedance matching can be improved over conventional approaches such as a T-type stub structure or a contact terminal through wiring structure. This can be due to a stereoscopic wiring structure when a main board bus line, on one side of a memory module socket, can be electrically connected to a module bus line on one side of a memory module. Module bus line can be routed up the memory module and electrically connected to a module bus line on the other side of the memory module by a module bus through wiring. Module bus line on the other side of memory module can be routed and electrically connected to the main board bus line on the other side of a memory module socket. This can enable the manufacture of memory modules which can be used in high speed memory applications such as high speed SDRAM.

When a memory module disclosed in the embodiments is used in a system, all of the sockets or slots may not contain a memory module. In this case, a dummy module may be inserted into the socket so that a main board bus can be electrically connected on both sides of the socket. A dummy module can serve as an electrical jumper. A dummy module may also include terminating resistors, which can properly terminate main board bus lines.

In the embodiments, as module bus lines and control signal lines can be arranged separately above and below memory on a wiring board, mutual signal interference may be reduced.

According to the embodiments, a circuit module can have an improved characteristic impedance matching with signal wiring on a main board. This can reduce reflections and/or distortions of transmitted signals thus allowing high-speed circuit modules without reducing the number of circuit modules, which can be arranged in parallel on a main board.

It is understood that the embodiments described above are exemplary and the present invention should not be limited to those embodiments. For example, the embodiments have been described in which SDRAM have been configured on a memory module. Memory modules can be configured with many other high-speed semiconductor memories. Furthermore, the invention can be applied to other high-speed modules containing integrated circuits that receive high-speed signals from main board bus lines.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A module provided with a wiring board that supports at least a first integrated circuit (IC) on one side and contact terminals on the one side and an opposite side of the wiring board, comprising:
   a first signal wiring formed on the one side, the first signal wiring electrically connecting a first one of the contact terminals on the one side and a pin of the first IC;
   a first through wiring having a first end connected to the first signal wiring, the through wiring piercing the wiring board near the first IC; and
   a second signal wiring formed on the opposite side of the wiring board, the second signal wiring electrically connecting a second end of the first through wiring with a first one of the contact terminals on the opposite side of the wiring board.

2. The module of claim 1, wherein the first through wiring is arranged in a position farther from the first one of the contact terminals on the one side of the wiring board than at least one pin of the first IC.

3. The module of claim 1, wherein each pin of the first IC is electrically connected to a corresponding contact terminal on the one side of the wiring board and a corresponding contact terminal on the opposite side of the wiring board.

4. The module of claim 3, wherein the wiring board supports at least the first and a second IC on the one side, the module further including:
   a third signal wiring that couples a contact terminal on the one side of the wiring board with a pin of the first IC;
   a fourth signal wiring that couples a contact terminal on the opposite side of the wiring board with a pin of the second IC.

5. The module of claim 4, wherein:
   a portion of the third and fourth signal wirings are arranged in parallel.

6. The module of claim 5, wherein:
   the third and fourth signal wirings are electrically connected by a second through wiring.

7. The module of claim 1, wherein:
   the first IC is a dynamic random access memory.

8. The module of claim 1, wherein the wiring board supports at least the first IC on the one side and a second IC on the opposite side, the module further including:
   a third signal wiring formed on the opposite side, the third signal wiring electrically connecting a second one of the contact terminals on the opposite side and a pin of the second IC;
   a second through wiring having a first end connected to the third wiring, the through wiring piecing the wiring board near the second IC; and
   a fourth signal wiring formed on the one side of the wiring board, the fourth signal wiring electrically connecting a second end of the second through wiring with a second one of the contact terminals on the one side of the wiring board.

9. A memory module provided with a wiring board having contact terminals on a front side and a back side, the memory module comprising:

a memory attached to the front side of the wiring board, the memory having a first external terminal;

a first signal wiring formed on the front side of the wiring board, the first signal wiring electrically connecting a first contact terminal on the front side of the wiring board with the first external terminal;

a first through wiring piercing the wiring board under the first signal wiring, the first through wiring having a first end connected to the first signal wiring; and a second signal wiring formed on the back side of the wiring board, the second signal wiring electrically connecting a second end of the first through wiring with a second contact terminal on the back side of the wiring board.

10. A memory module of claim 9, wherein the first through wiring is located near the first external terminal of the memory.

11. The memory module of claim 9, wherein the distance between the first through wiring and the first contact terminal on the front side is greater than the distance between the external terminal of the memory and the first contact terminal on the front side.

12. The memory module of claim 9, wherein the memory is a Random Access Memory.

13. The memory module of claim 12, further including:

a buffer attached to the front side of the wiring board, the buffer having a second external terminal;

a third signal wiring formed on the front side of the wiring board, the third signal wiring electrically connecting a third contact terminal on the front side of the wiring board with the second external terminal;

a second through wiring piecing the wiring board under the third signal wiring, the second through wiring connecting having a first end connected to the third signal wiring; and a fourth signal wiring electrically connecting a second end of the second through wiring with a fourth contact terminal on the back side of the wiring board.

14. The memory module of claim 9, wherein the memory is a Double Data Rate Synchronous Random Access Memory.

15. The memory module of claim 9, wherein the memory is a Quadruple Data Rate Synchronous Random Access Memory.

16. A module provided with a wiring board having front side contact terminals formed on a front side of the wiring board and back side contact terminals formed on a back side of the wiring board, the module comprising:

a first integrated circuit (IC) attached to the front side of the wiring board, the first IC having a first pin;

a first wiring formed on the front side of the wiring board, the first wiring provides a signal path in a first direction between a first front side contact terminal and the first pin of the first IC;

a second wiring formed on the back side of the wiring board, the second signal wiring provides a signal path in the first direction from a first back side contact terminal; and a first through wiring located away from and in the first direction with respect to the contact terminals, the first through wiring provides a signal path between the first and second wiring.

17. The module of claim 16, wherein the first pin of the first IC is attached to a first edge of the first IC, the first IC further includes a second pin attached to a second edge of the first IC and the distance between the second pin and the contact terminals on the front side of the module is farther than the distance between the first pin and the contact terminals on the front side of the module, and a buffer is coupled between at least one contact terminal and the second pin.

18. The module of claim 16, wherein the first pin of the first IC is attached to a first edge of the first IC, the first IC further includes a second pin attached to a second edge of the first IC and the distance between the second pin and the contact terminals on the front side of the module is farther than the distance between the first pin and the contact terminals on the front side of the module, the module further includes:

a second IC attached to the front side of the wiring board, the second IC includes a third pin and a fourth pin wherein the third pin is attached to a first edge of the second IC, and the fourth pin is attached to a second edge of the second IC and the distance between the fourth pin and the contact terminals on the front side of the module is farther than the distance between the third pin and the contact terminals on the front side of the module;

a third wiring formed on the front side of the wiring board, the third wiring provides a signal path between a second front side contact and the second pin of the first IC; and a fourth wiring formed on the back side of the wiring board, the fourth wiring provides a signal path between a second back side contact and the fourth pin of the second IC.

19. The module of claim 18, wherein a portion of the third wiring and a portion of the fourth wiring are arranged in parallel.

20. The module of claim 19, further including:

a second through wiring providing a signal path between the third wiring and fourth wiring.

* * * * *